United States Patent
Steinhoff et al.

(10) Patent No.: US 9,539,749 B2
(45) Date of Patent: Jan. 10, 2017

(54) FORMABLE INSERTS AND RELATED METHODS

(75) Inventors: William Stephen Steinhoff, Plantation, FL (US); Ming-Lun Dave Ma, Kitchener (CA)

(73) Assignee: BlackBerry Limited, Waterloo, Ontario (CA)

( * ) Notice: Subject to any disclaimer, the term of this patent is extended or adjusted under 35 U.S.C. 154(b) by 956 days.

(21) Appl. No.: 13/471,620

(22) Filed: May 15, 2012

(65) Prior Publication Data

US 2013/0309444 A1   Nov. 21, 2013

(51) Int. Cl.

| | |
|---|---|
| *B29C 45/14* | (2006.01) |
| *B32B 3/04* | (2006.01) |
| *H05K 5/02* | (2006.01) |
| *H04M 1/02* | (2006.01) |
| *B32B 9/02* | (2006.01) |
| *B32B 9/04* | (2006.01) |
| *B32B 1/08* | (2006.01) |
| *B29L 31/34* | (2006.01) |
| *B29C 45/33* | (2006.01) |

(52) U.S. Cl.
CPC .......... *B29C 45/14196* (2013.01); *B32B 1/08* (2013.01); *B32B 3/04* (2013.01); *B32B 9/025* (2013.01); *B32B 9/04* (2013.01); *H04M 1/0283* (2013.01); *H05K 5/0243* (2013.01); *B29C 45/14811* (2013.01); *B29C 45/33* (2013.01); *B29L 2031/3481* (2013.01); *B32B 2597/00* (2013.01); *Y10T 428/24223* (2015.01)

(58) Field of Classification Search
CPC ............... B29C 45/14196; B29C 2045/14204; B29C 2045/14057
See application file for complete search history.

(56) References Cited

U.S. PATENT DOCUMENTS

| | | | | |
|---|---|---|---|---|
| 3,075,862 | A | * | 1/1963 | Hoyer .................... B29C 63/02 156/216 |
| 5,324,384 | A | * | 6/1994 | Spengler ................ B29C 63/04 156/227 |
| 5,629,029 | A |   | 5/1997 | Souder et al. |
| 5,718,791 | A | * | 2/1998 | Spengler ................ B29C 51/16 100/269.07 |

(Continued)

FOREIGN PATENT DOCUMENTS

| | | |
|---|---|---|
| DE | 4317233 | 12/1994 |
| JP | S6299122 | 5/1987 |
| JP | 09131752 | 5/1997 |

OTHER PUBLICATIONS

"Method of Making an Interior Trim Panel Assembly," research disclosure, Mason Publications, No. 440, Dec. 1, 20000, 2 pages.

(Continued)

*Primary Examiner* — Jill Heitbrink
(74) *Attorney, Agent, or Firm* — Fish & Richardson P.C.

(57) ABSTRACT

Formable inserts and related methods are disclosed herein. An example of forming a cover with a formable insert includes forming a first frame portion of the cover, attaching a formable insert to the first frame portion of the cover, and forming a second frame portion of the cover subsequent to the formation of the first frame portion to capture a perimeter edge of the formable insert in the second frame portion of the cover.

18 Claims, 10 Drawing Sheets

(56) References Cited

U.S. PATENT DOCUMENTS

| | | | |
|---|---|---|---|
| 5,925,207 A * | 7/1999 | Itoh | B29C 63/04 |
| | | | 156/212 |
| 5,951,802 A * | 9/1999 | Deeks | B29B 11/06 |
| | | | 156/214 |
| 5,997,675 A * | 12/1999 | Miyake | B08B 17/06 |
| | | | 156/221 |
| 6,926,856 B2 | 8/2005 | Hus et al. | |
| 7,396,500 B2 | 7/2008 | Wani et al. | |
| 2006/0204731 A1 | 9/2006 | Wani et al. | |
| 2007/0199797 A1 | 8/2007 | Sell et al. | |
| 2008/0017304 A1 | 1/2008 | Sell et al. | |
| 2009/0277676 A1 | 11/2009 | Chang et al. | |
| 2009/0305000 A1* | 12/2009 | Schoemann | B29C 45/1676 |
| | | | 428/174 |
| 2011/0180294 A1 | 7/2011 | Qin et al. | |
| 2011/0272851 A1 | 11/2011 | Hayes et al. | |
| 2011/0318591 A1 | 12/2011 | Wu et al. | |

OTHER PUBLICATIONS

European Patent Office, "European Search Report," issued in connection with application serial No. 12168108.4, issued Oct. 23, 2012, 7 pages.

Leaversuch, Robert D., "Molded-In Fabrics Give New look and Feel to Electronic Enclosures," Plastics Technology, Aug. 2003, 2 pages.

"Injection Mold Tooling," Inclosia Signs EXO Technology Licensing Agreement with Mosen, IMT News, Jun. 24, 2005, 2 pages.

Communication Pursuant to Article 94(3) EPC issued in related European Application No. 12168108.4 on Mar. 17, 2016.

* cited by examiner

FORMABLE INSERTS AND RELATED METHODS

FIELD OF DISCLOSURE

The present disclosure relates to molded parts, including but not limited to, formable inserts and related methods.

BACKGROUND

Electronic devices, including portable electronic devices, have gained widespread use and may provide a variety of functions including, for example, telephonic, electronic messaging, and other personal information manager (PIM) application functions. Portable electronic devices include, for example, several types of mobile stations such as simple cellular telephones, smart telephones, tablet computers, wireless personal digital assistants (PDAs), and laptop computers with wireless 802.11 or Bluetooth capabilities.

Electronic devices such as, for example, portable electronic devices employ a housing to enclose or contain various electronic or mobile components such as a microprocessor, a display, a keypad, a speaker, a microphone, etc. The housing may include a front cover or lid that couples to a frame or base to capture the electronic components within the housing.

Some known electronic devices employ a formable insert (e.g., a fabric or leather) applied to a cover to provide desirable attributes such as aesthetic appearance, desirable contact surface for gripping or feel, design variations or the like. Typically, the insert is attached to the cover via insert molding. In some instances, however, it can be difficult to provide a robust attachment of the insert to the cover. As a result, the insert can detach from the cover. In particular, edges of the insert fray or become damaged. In some instances, a parting line (e.g., due to mold tool) forms between the insert and the cover that is visible from an exterior surface of the electronic device and can be aesthetically unappealing.

DETAILED DESCRIPTION

Figure 1A:
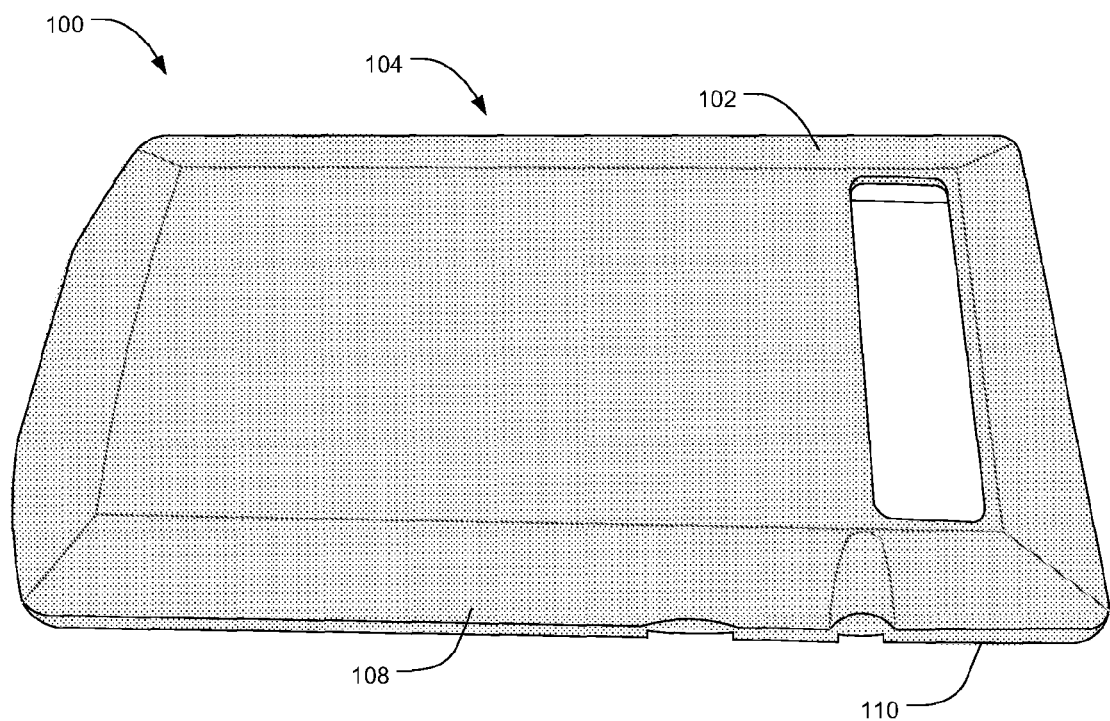
FIG. 1A illustrates a first side of an example cover having a formable insert formed in accordance with the teachings disclosed herein.

Certain examples are shown in the above-identified figures and described in detail below. In describing these examples, like or identical reference numbers are used to identify common or similar elements. The figures are not necessarily to scale and certain features and certain views of the figures may be shown exaggerated in scale or in schematic for clarity. Additionally, several examples have been described throughout this specification. Any features from any example may be included with, a replacement for, or otherwise combined with other features from other examples.

Formable insert materials (e.g., fabrics, leathers, decorative laminates, etc.) are often applied to molded parts such as plastic substrates via in-molding insert manufacturing methods. For example, a cover of an electronic device may be provided with a fabric or decorative laminate. Some known processes apply the formable insert to the plastic substrate via injection molding. The known insert may be a planar overlay or may be pre-formed and cut to fit the mold tool cavity. After the insert is provided in the mold, molding resin is injected into the mold cavity to form the plastic substrate. In turn, the insert bonds to the molding resin as the molding resin cools to form an integral part. To prevent inserts from burning or melting due to the temperature of the molding resin, an insulating material(s) is often employed and disposed between the insert and the molding resin. In some instances, the insert may be provided with an additional thickness to protect the insert from damage (e.g., burning) due to the relatively high temperatures of molten resin during the molding process. For example, an insert may have an additional thickness of approximately between 0.05 and 0.18 millimeters. In some examples, to reduce damage to the insert material, the resin thickness may be relatively greater (e.g., increased) to reduce pressure and/or surface area heat that would otherwise be transferred to the insert during, for example, insert molding. Typically, for insert molding, a resin thickness up to 0.4 millimeters may be provided to reduce pressures, heat and/or friction.

To form an example part or frame (e.g., a cover) disclosed herein, a first substrate or a first frame portion is provided, molded, or formed. For example, the first frame portion is formed having a slightly smaller dimensional profile relative to the dimensional profile of the part or frame (e.g., the intended final part). For example, the first frame portion may have at least one dimensional value that is less than a respective dimensional value of the part (e.g., the final product or frame). An example first frame portion disclosed herein may have a first dimensional height (e.g., a height between a first side or back side and a second side or front side of the first frame portion) that is less than a respective dimensional height of the part. In some examples, the dimensional height of the first frame portion may be approximately between 0.2 and 10 millimeters less than the dimensional height of the part.

As a result, providing the first frame portion with a dimensional value less than the dimensional value of the part enables a portion of a formable insert or an exoskeleton or exterior skin to be folded relative to the first frame portion. For example, the formable insert may be attached to the first frame portion to provide a foldable portion or lip protruding from a respective edge of the first frame portion.

In this manner, the lip may be folded relative to the first frame portion and a second frame portion may be formed or created to seal, encase or otherwise capture a perimeter edge of the lip and/or the exoskeleton formable insert in the second frame portion when the lip is folded toward the first frame portion. As a result, the perimeter edge of the lip of an example cover disclosed herein may not be visible from an exterior surface of the part. In some examples, the formable insert may be formed and/or shaped via thermoforming. Further, a second frame portion disclosed herein may provide the remaining portion of the part. For example, an example first frame portion disclosed herein may have a dimensional height that is approximately between 0.2 millimeters and 10 millimeters less than a dimensional height of an example part. The second frame portion, for example, may have a dimensional height of approximately between 0.2 millimeters and 10 millimeters.

To seal or otherwise cover the perimeter edge of the example formable insert disclosed herein, the first frame portion and the formable insert may be undermolded with a material (e.g., plastic). The material, when cooled, defines the second frame portion. For example, the formable insert and the first frame portion may be positioned in a cavity of a mold tool and the lip of the formable insert may be folded relative to a parting line of the mold tool. A slide or tool, for example, may be employed to fold the lip relative to the parting line of the mold tool toward the first frame portion while the insert and the first frame portion are inside the cavity of the mold tool. As the slide folds the lip relative to the parting line of the mold tool, a portion of the formable insert may be undermolded with molding resin to seal the perimeter edge. Thus, a part or frame of the illustrated examples disclosed herein includes the first frame portion, the second frame portion and the formable insert. Before the formation of the second frame portion, the formable insert is applied or attached to the first frame portion. As a result of the example methods disclosed herein, secondary trimming operations otherwise required to trim the edges of the formable insert may not be needed and/or may be employed reducing the precision required during trimming (e.g., does not require trimming to a relatively small dimensional value or tolerance).

Example formable inserts and related methods described herein generally provide a decorative or aesthetically appealing surface to a substrate or a frame (e.g., a plastic substrate, a metal substrate, etc.). More specifically, a perimeter edge of a formable insert as disclosed herein is not visible from an exterior surface of the formable insert and/or the frame. In particular, the perimeter edge of the formable insert is embedded, sealed, encased or otherwise covered to prevent the edge of the formable insert from fraying or becoming damaged (e.g., from peeling away from a surface of a frame), thereby increasing the durability of a part.

Figure 1B:
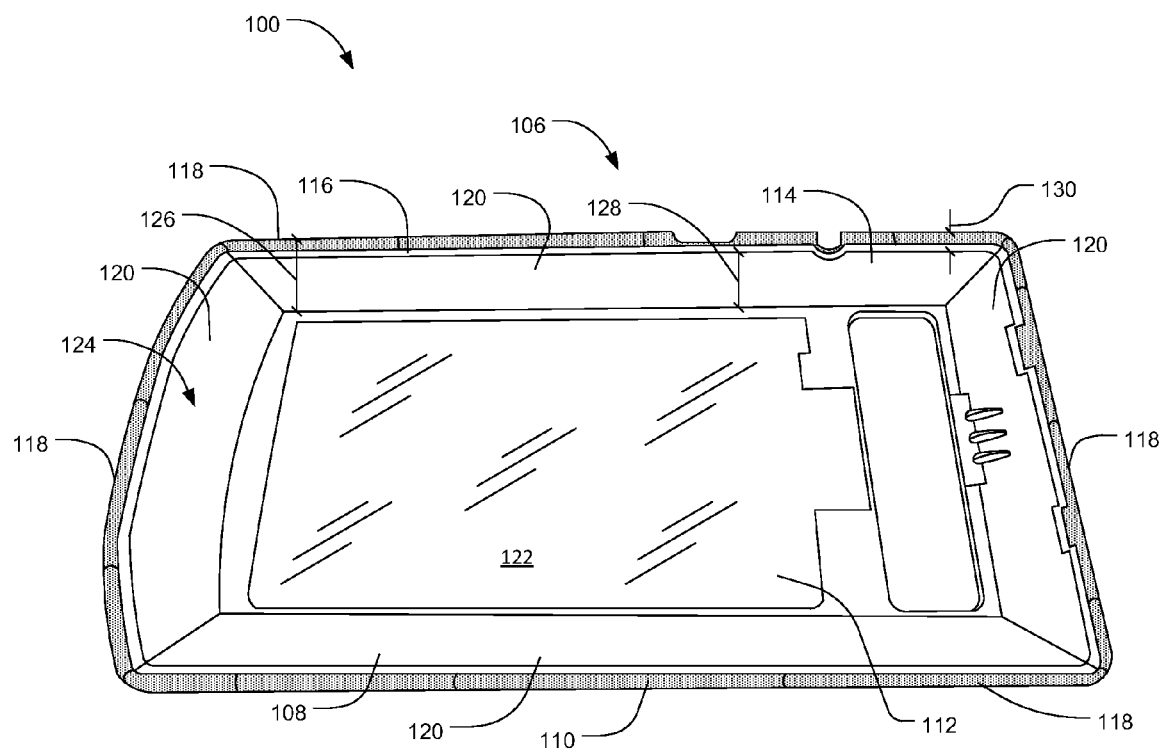
FIG. 1B illustrates a second side of the example cover of FIG. 1A.

FIGS. 1A and 1B illustrate an example part or frame 100 having a formable insert 102 in accordance with the teachings disclosed herein. FIG. 1A illustrates a first or outer surface 104 of the part 100. FIG. 1B illustrates a second or inner surface 106 of the part 100. In the illustrated example of FIGS. 1A and 1B, the part 100 is a cover 108 such as, for example, a battery cover. The cover 108 has a profile (e.g., a shape and/or size) to engage (e.g., matably engage) another housing portion (not shown) of an electronic device such as, for example, a portable electronic device. For example, the cover 108 may be used to implement a housing of a mobile device that can be held in one hand by a user of the mobile device during data (e.g., text) and/or voice communications.

As shown in FIGS. 1A and 1B, the example formable insert 102 does not have a parting line visible from the outer surface 104 of the cover 108. To eliminate or otherwise hide from view the parting line from the outer surface 104 of the cover 108, a foldable portion 110 of the formable insert 102 is folded toward an inner surface 112 of the cover 108. More specifically, the foldable portion 110 of the formable insert 102 is folded relative to a first frame 114 of the cover 108 and is sealed, captured or encased by a second frame 116 of the cover 108. As described below, to seal the example foldable portion 110 of the formable insert 102 in the second frame 116, the second frame 116 is formed subsequent to the formation of the first frame 114. Thus, the example formable insert 102 is attached or coupled to the first frame 114 prior to formation of the second frame 116. As shown in the illustrated example, the first frame 114 and the second frame 116 form a substantially unitary structure.

The example second frame 116 secures, seals, attaches, captures and/or otherwise couples the folded portion of the formable insert relative to the inner surface 112 of the first frame 114. More specifically, perimeter edges (not shown) of the formable insert 102 are encased, embedded or otherwise captured by the second frame 116 and, thus, are hidden. As a result, the perimeter edges of the formable insert 102 are less susceptible to fraying or becoming damaged (e.g., peeling away from the first frame 114).

Referring to FIG. 1B, the example cover 108 has perimeter edges 118 that define a shape or profile of the cover 108. The cover 108 of the illustrated example has sides 120 that protrude from a base 122 of the first frame 114 to define a cavity 124. The cavity 124 may receive, for example, electronic components of a mobile device (e.g., a microprocessor, a battery, etc.). The sides 120 of the cover 108 have a dimensional height or value 126. In particular, the dimensional height 126 of the cover 108 is defined by a dimensional height 128 of the first frame 114 and a dimensional height 130 of the example second frame 116. Thus, the first frame 114 includes a dimensional value (e.g. the dimensional height 128) that is less than a respective dimensional value (e.g., the dimensional height 126) of the cover 108. In other words, the first frame 114 is formed to have a surface area that is smaller than a surface area of the cover 108. Also, the dimensional height 130 of the second frame 116 is approximately equal to the difference between the dimensional height 126 of the cover 108 and the dimensional height 128 of the first frame 114. For example, the dimensional height 130 of the second frame 116 may be approximately between 0.2 to 10 millimeters. Thus, the sides 120 of the illustrated example are defined by the first frame 114 and the second frame 116 and each of the first and second frames 114 and 116 define respective openings that at least partially define the cavity 124 of the cover 108.

Figure 2:
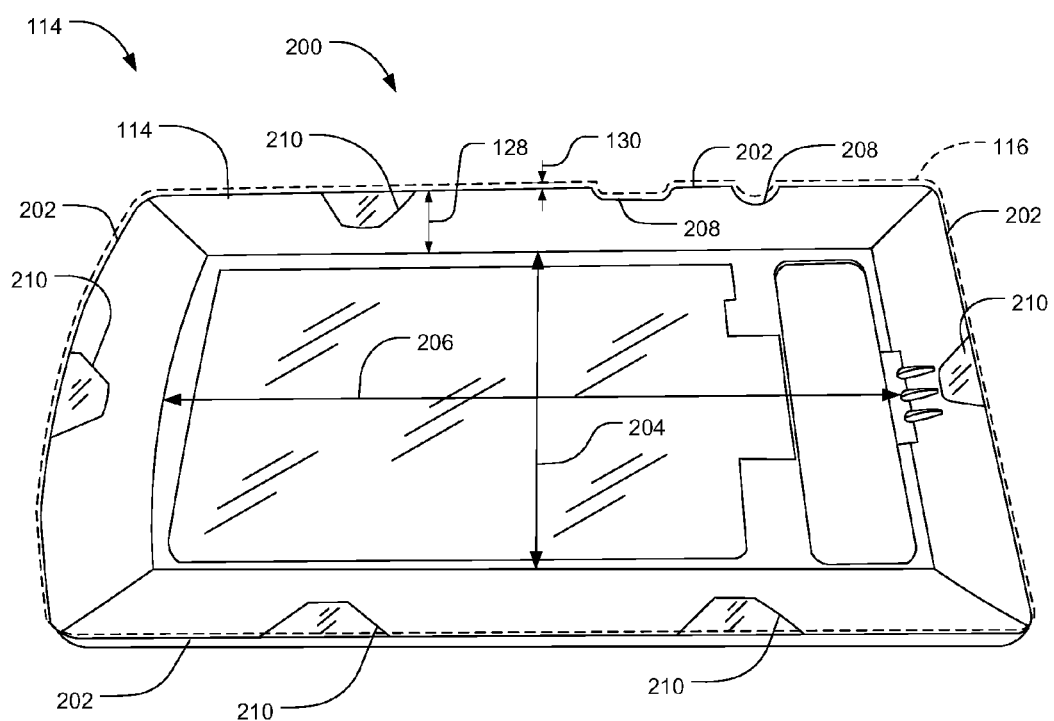
FIG. 2 illustrates an example first frame of the example cover of FIGS. 1A and 1B.

FIG. 2 is a bottom view 200 of the example first frame 114 of FIGS. 1A and 1B. The profile, a shape and/or a size of the first frame 114 of FIG. 2 is defined by perimeter edges 202. The first frame 114 has a dimensional width 204, a dimensional length 206 and the dimensional height 128. As noted above, the first frame 114 of FIG. 2 is formed smaller (e.g., 10% smaller) than the dimensional profile of the part 100 or cover 108. For example, the first frame 114 may have a surface area of approximately between 90% and 99% of a surface area of the cover 108. In particular, the first frame 114 is dimensioned or configured to accommodate the second frame 116, which is shown in FIG. 2 in dashed lines for illustrative purposes. Thus, compared to the cover 108 of FIGS. 1A and 1B, the dimensional value (e.g., the dimensional height) of the example first frame 114 is approximately less than the dimensional height 126 of the part 100 by a dimensional value substantially equal to the dimensional height 130 of the second frame 116.

The first frame 114 of the illustrated example may be formed via injection molding, forming, machining and/or any other suitable manufacturing process(es). For example, a mold tool (e.g., a cavity and a core) may be formed with a cavity having a profile (e.g., a shape and/or size) substantially similar or identical to the profile, shape and/or contours of the first frame 114. To form the first frame 114, the cavity of the mold tool is injected with a first molding resin or material. For example, the molding resin or material may be a plastic or other resin material. The first frame 114 of the illustrated example is composed of a glass-reinforced nylon resin (PA+50% GF). However, in other examples, the first frame 114 may be composed of any other suitable material such as a thermoset (e.g., polyurethane), a thermoplastic (e.g., polycarbonate, ABS, polyethylene, etc.), a composite and/or any other suitable material(s). Alternatively, the first frame 114 of FIG. 2 may be composed of metal, aluminum, carbon fiber or any other suitable material(s). For example, a frame composed of metal, aluminum or carbon fiber may be formed via machining, forming, stamping and/or any other suitable manufacturing process(es).

Additionally or alternatively, the first frame 114 of the illustrated example may include openings 208 (e.g., semicircular or partial openings) to receive, for example, buttons or other features of a mobile device. Additionally or alternatively, the first frame 114 of the illustrated example may be optionally provided with one or more recesses 210 to provide for one or more respective gates of a mold tool. As shown in the illustrated example, the recesses 210 have a trapezoidal shape or profile and are formed adjacent the perimeter edges 202 of the first frame 114. When the first frame 114 is not formed via injection molding, the recesses 210 may, optionally, not be included.

Figure 3A:
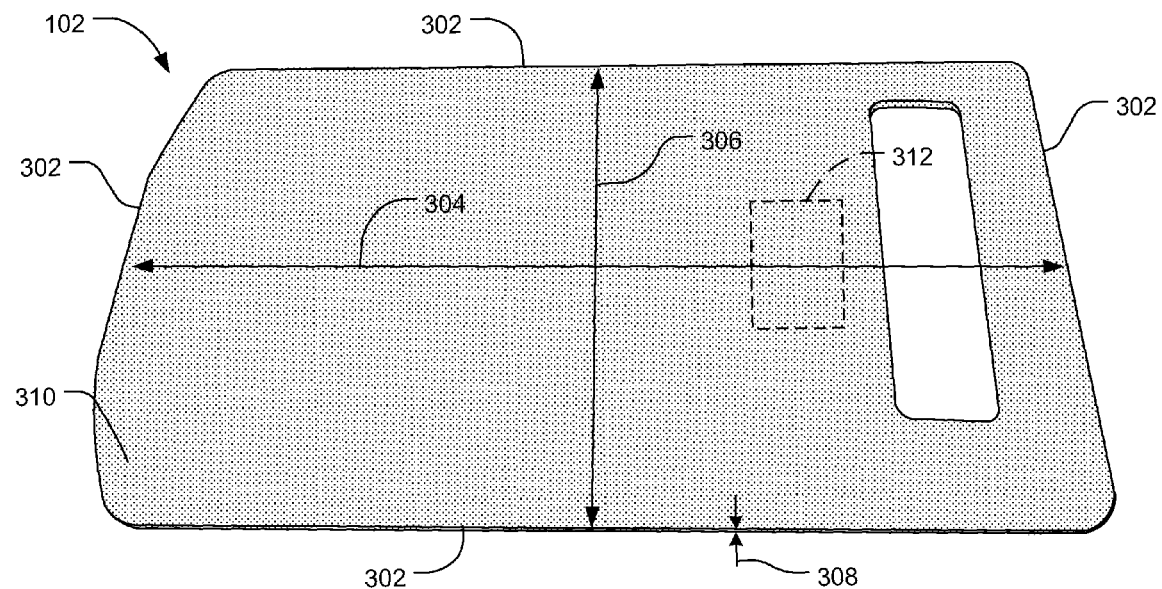
FIG. 3A illustrates a first side of the example formable insert of FIGS. 1A and 1B prior to being attached to the example cover.
Figure 3B:
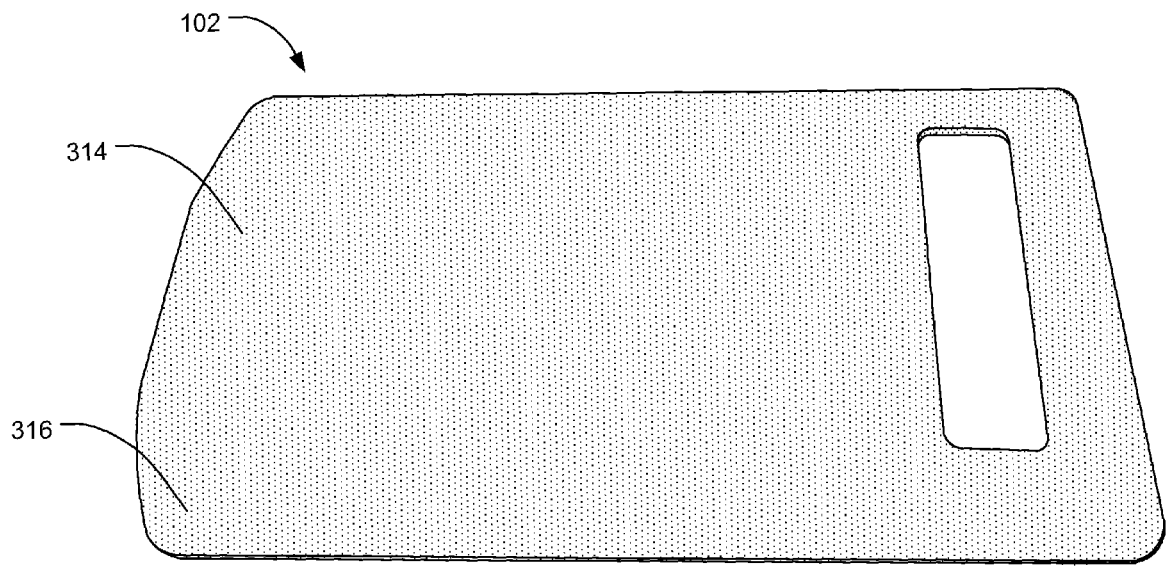
FIG. 3B illustrates a second side of the example formable insert of FIG. 3.

FIG. 3A illustrates a first or front side of an example formable insert 102 of FIGS. 1A and 1B prior to being formed and/or attached to the first frame 114. FIG. 3B illustrates a second or back side of the formable insert 102. Referring to FIGS. 3A and 3B, the example formable insert 102 is defined by perimeter edges 302 having a similar shape or profile as the first frame 114. In particular, the formable insert 102 includes a dimensional length 304, a dimensional width 306 and a dimensional thickness 308. For example, the dimensional thickness 308 may be approximately 0.5 to 0.75 millimeters. The formable insert 102 of FIGS. 3A and 3B may be a pre-cut insert or laminate 310 and may be shaped via, for example, stamping, die cutting, laser cutting, and/or any other suitable process(es).

As shown in FIGS. 3A and 3B, the example formable insert 102 is substantially planar or flat and may be formed in any suitable shape. The formable insert 102 of the illustrated example is real leather. In other examples, the formable insert 102 may include, but is not limited to, synthetic leather, suede, textile material such as a woven or non-woven fabric from natural or synthetic materials, laminate or composite materials, and/or a combination thereof to form a multi-layer laminate formable insert material such as, for example, a leather material layered with a plastic film material. The formable insert 102 is generally flexible such that it does not return to a predetermined shape (such as shown in FIG. 3A) after the formable insert 102 is formed to a desired shape or profile. For example, the formable insert 102 may conform to the shape or contours of the first frame 114 as shown in FIGS. 1A and 1B. In some examples, the formable insert 102 may be composed of different fabrics or materials such that different exposed sections of the formable insert 102 may be composed of different materials. Further, in some examples, the formable insert 102 may include indicia 312 such as, for example, a logo, text and/or any other indicia. For example, the indicia 312 may be provided to the formable insert 102 via printing, branding, lamination and/or any other suitable process(es).

As shown in FIG. 3B, an adhesive 314 (e.g., glue) is applied to a back surface 316 of the formable insert 102 to attach or bond the formable insert 102 to the first frame 114. Further, although not shown, a backing or support member may be bonded or coupled to the formable insert 102. In some examples, the backing member may facilitate shaping or forming the formable insert 102 to the shape of the first frame 114, may stiffen the formable insert 102, and/or may provide support to the formable insert 102 during molding. The backing member may be a relatively thin film member. Some example backing members may include, but are not limited to, films, foams, plastics, fabrics, etc.

Figure 4:
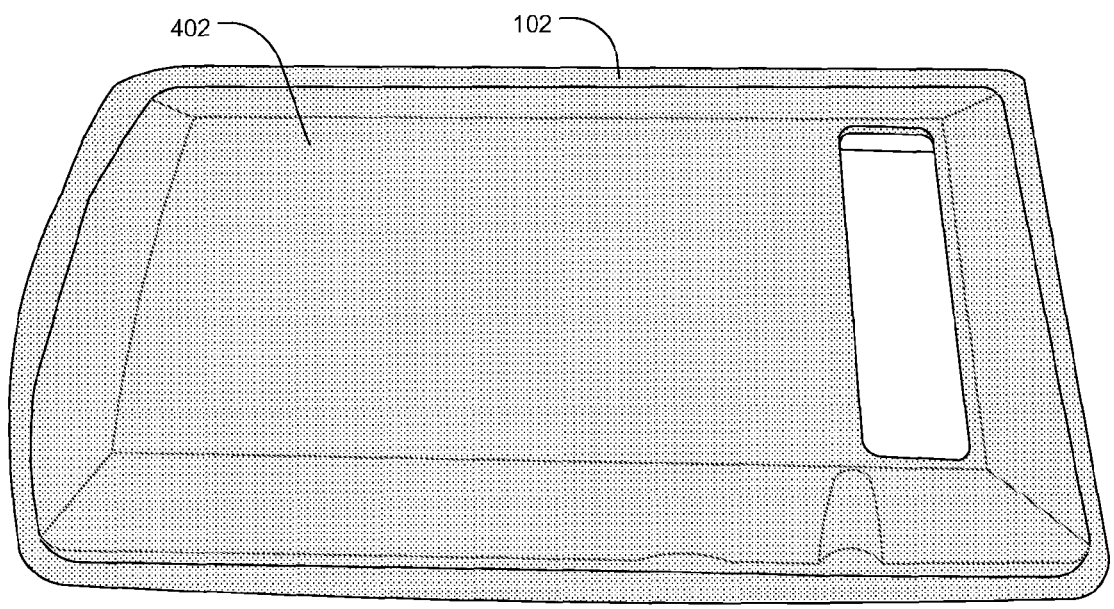
FIG. 4 illustrates the example formable insert of FIG. 3A and FIG. 3B attached to the example first frame of FIG. 2.

FIG. 4 is a front view of the example formable insert 102 attached to the first frame 114. The formable insert 102 may be applied to the first frame 114 via adhesive, heat activated adhesive, thermoforming, high pressure forming, vacuum pressure forming, thermal bonding and/or any other suitable manufacturing process(es). For example, the formable insert 102 may be pressed on the first frame 114 to conform to the shape, contour or profile of the first frame 114. To facilitate shaping, a pressure may be applied to an outer surface 402 of the formable insert 102 and/or a vacuum may be applied to the inner surface 112 of the first frame 114. In some examples, heat may be applied to the formable insert 102 to assist or facilitate shaping or forming the formable insert to the shape or contours of the first frame.

Figure 5:
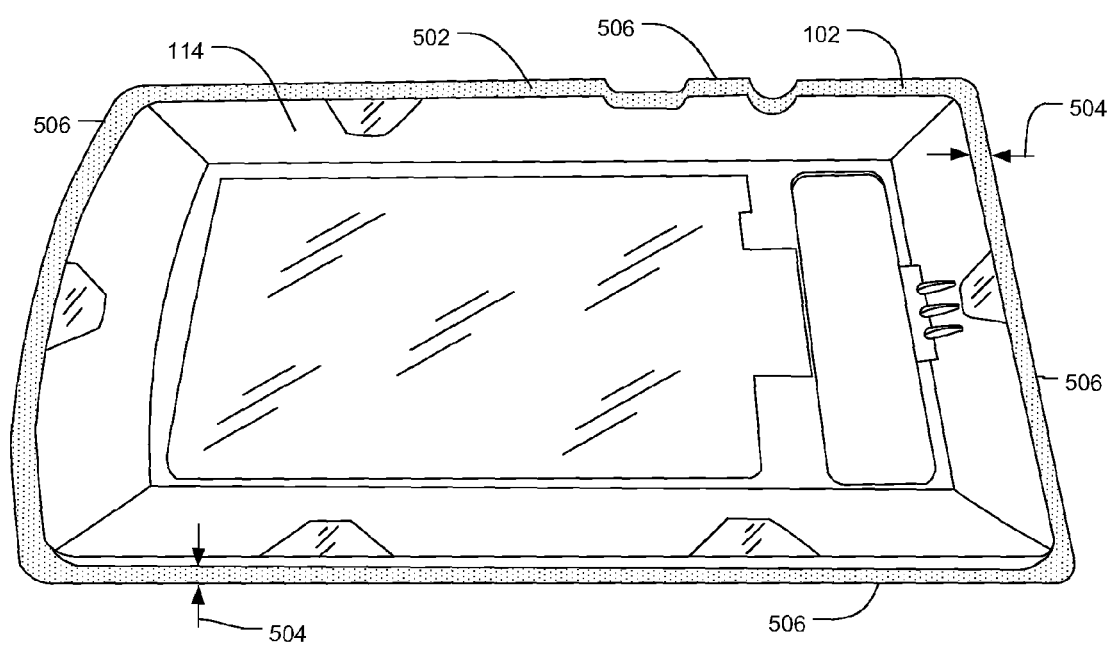
FIG. 5 illustrates another view of the example formable insert and the example first frame of FIG. 4.

FIG. 5 is a back view of the example first frame 114 when the formable insert 102 is attached to the first frame 114. When the formable insert 102 is applied or attached to the first frame 114, the example formable insert 102 defines a lip or edge 502 (e.g., the foldable portion 110 of FIG. 1B) adjacent the perimeter edges 202 of the first frame 114. The lip 502 extends or protrudes from the perimeter edges 202 of the first frame 114 such that the formable insert 102 has a dimensional profile that is larger than the dimensional profile of the first frame 114. For example, the lip 502 may extend a distance 504 of, for example, between 0.2 millimeters and 10 millimeters relative to the perimeter edges 202 of the first frame 114. Further, in some instances, the lip 502 may be trimmed to define perimeter edges 506 of the formable insert 102. For example, the lip 502 may be trimmed to enable the formable insert 102 to properly fit within a mold cavity as described in greater detail below. The lip 502 of the formable insert 102 is of sufficient length to fold over and/or across the perimeter edges 202 of the example first frame 114 of FIG. 1B and FIG. 2 and/or a parting line of a mold tool as described in greater detail below in connection with FIGS. 6-8.

Figure 6:
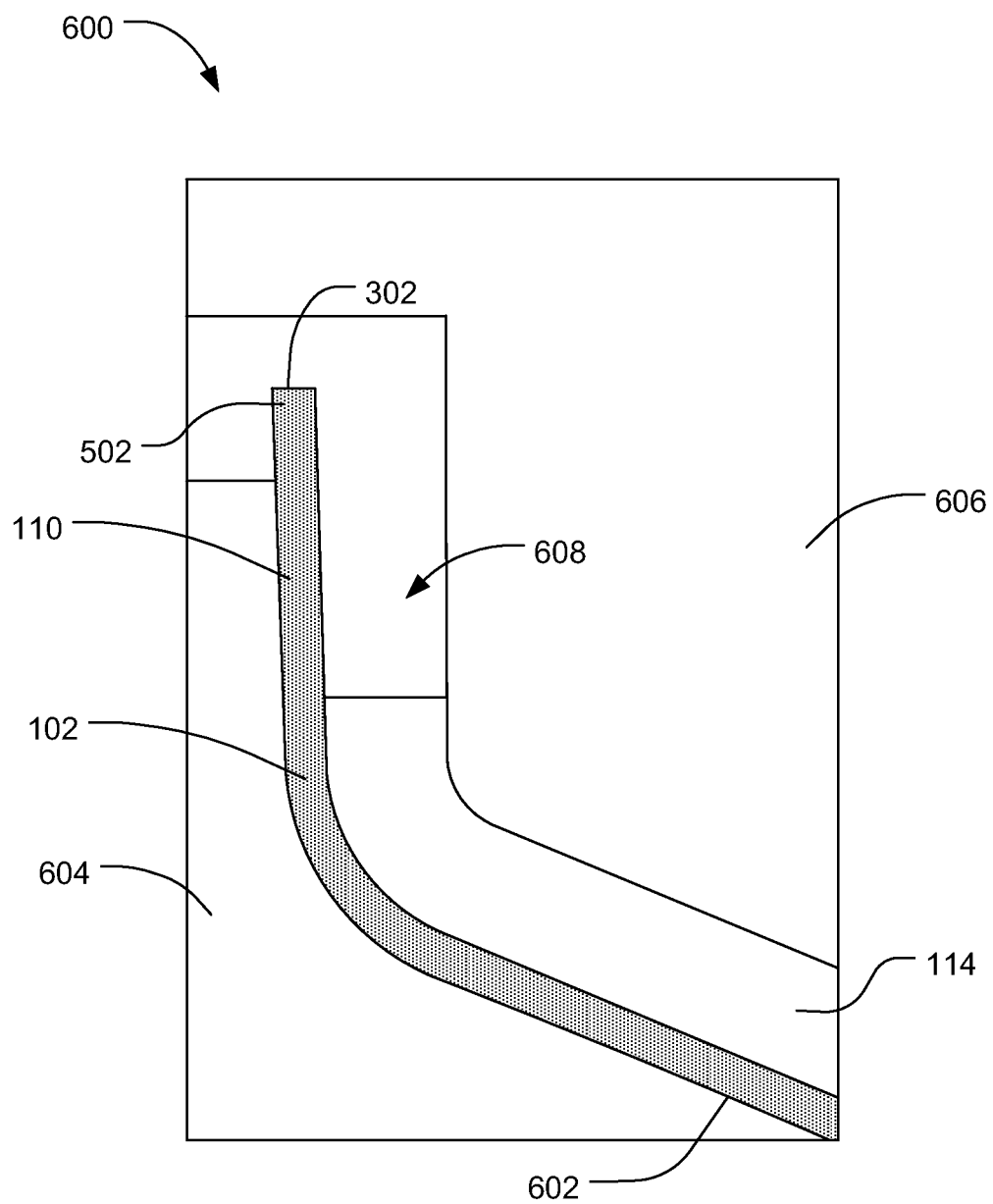
FIG. 6 illustrates the example first frame and the attached formable insert positioned in a mold tool.
Figure 7:
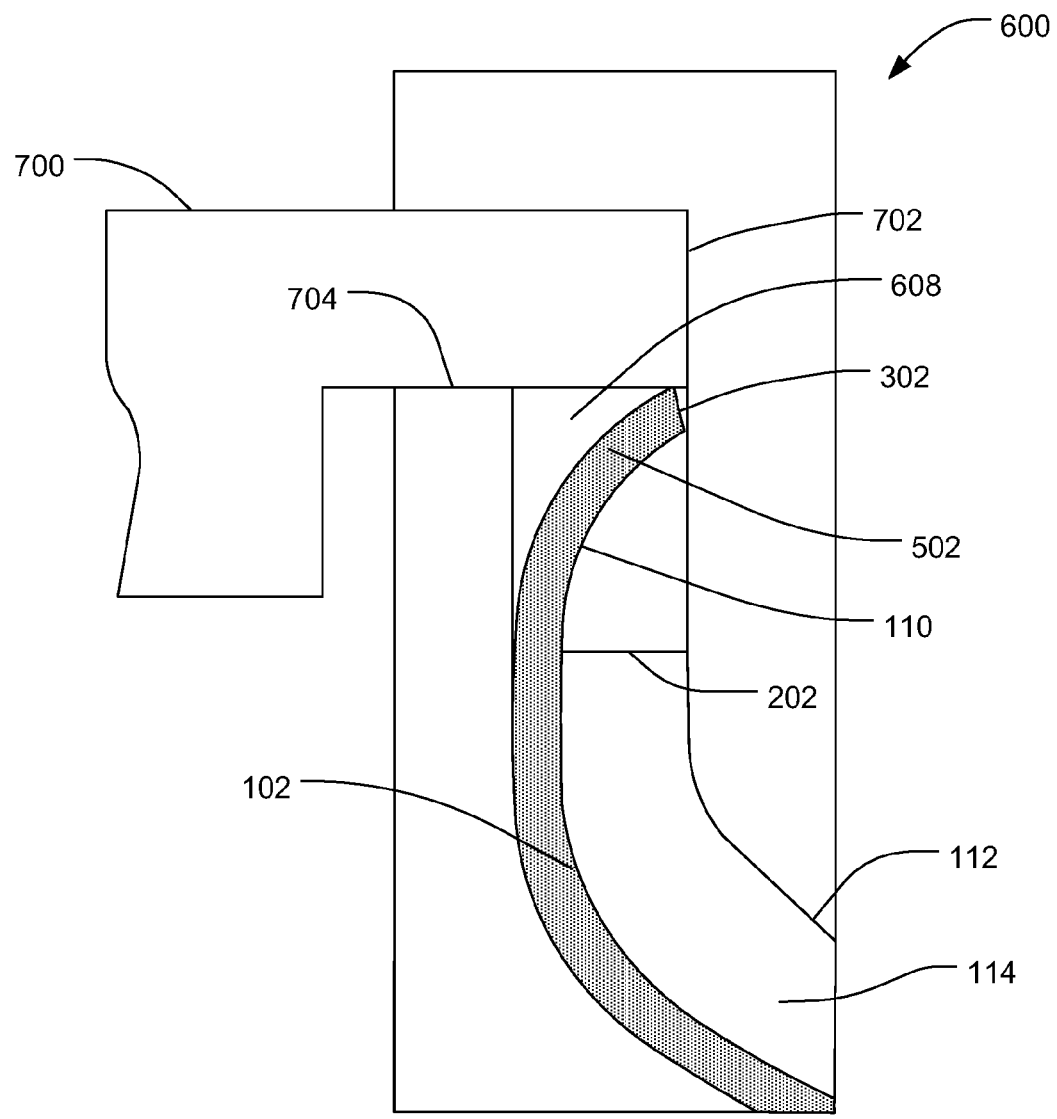
FIG. 7 illustrates a portion of the example formable insert folded relative to the example first frame when the first frame and the formable insert are positioned in the mold tool.
Figure 8:
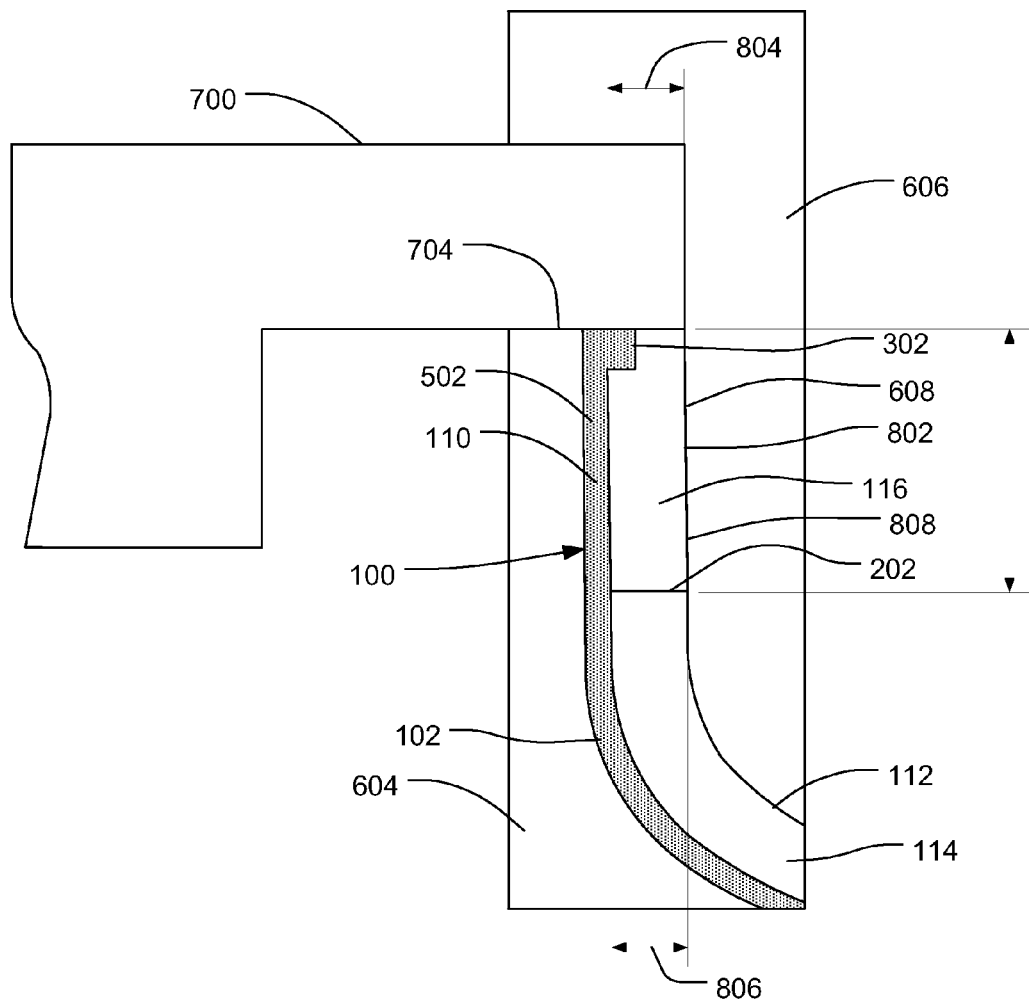
FIG. 8 illustrates an example second frame of the cover formed via the mold tool.

FIGS. 6-8 illustrate an example mold tool 600 to form the second frame 116 of FIGS. 1A and 1B. Referring to FIG. 6, the first frame 114 having the attached formable insert 102 is positioned in a cavity 602 of the mold tool 600. The mold tool 600 includes a first mold part or die 604 (e.g., providing the cavity 602) and a second mold part or die 606 (e.g., a core). The first frame 114 and the formable insert 102 are disposed within the cavity 602 of the first die tool 604 and the core 606 is positioned relative to the first die tool 604 to form or define an injection cavity 608. In particular, at least a portion of the foldable portion 110, the lip 502 and/or the perimeter edge 302 of the formable insert 102 is positioned and/or extends into the injection cavity 608. In some examples, the lip 502 of the formable insert 102 may be trimmed to fit within the cavity 602 of the mold tool 600.

Referring to FIG. 7, a slide 700 is inserted in an opening 702 of the mold tool 600 to engage the lip 502 of the formable insert 102 in the mold tool 600. In particular, the example slide 700 folds the lip 502 of the formable insert 102 relative to a parting line 704 of the mold tool 600 (and/or the perimeter edge 202 of the first frame 114) and toward the inner surface 112 of the first frame 114. As shown in the example of FIG. 7, the slide 700 also seals the injection cavity 608.

Referring to FIG. 8, after the lip 502 of the formable insert 102 is folded relative to the parting line 704, a material is injected into the injection cavity 608 of the mold tool 600 to form the second frame 116 and, thus, the part 100 of FIGS. 1A and 1B. In particular, the material is injected in the injection cavity 608 between the perimeter edge 302 of the foldable portion 110 of the formable insert 102 and the perimeter edge 202 of the first frame 114. As a result, the second frame 116 seals, encases, captures or covers the perimeter edges 302 of the formable insert 102. As shown in FIG. 8, the perimeter edge 302 of the foldable portion 110 of the formable insert 102 has been positioned or oriented toward the inner surface 112 of the first frame 114. Further, the perimeter edge 302 is disposed or embedded in the second frame 116 to prevent the perimeter edge 302 from fraying or peeling away from the first frame 114 and/or second frame 116, thereby increasing the durability and/or the aesthetic appeal of the formable insert 102. Thus, in the illustrated example, the lip 502 is trimmed to a length that enables the foldable portion 110 to fold relative to the first frame 114, but prevents the perimeter edge 302 of the lip 502 from protruding from an inner surface 802 of the second frame 116.

Alternatively, in some examples, the perimeter edge 302 may not be folded toward the inner surface 112 of the cover 108. In some such examples, the perimeter edge 302 may not be embedded or encased in the second frame 116. Further, in some such examples, the perimeter edge 302 may be trimmed after the injection of the material to form the second frame 116.

In the illustrated example, the material used to form the second frame 116 is substantially similar or identical to a first material used to form the first frame 114. For example, the first frame 114 and the second frame 116 of the illustrated example are formed from a glass-reinforced nylon resin (PA+50% GF). However, in other examples, the second frame 116 may be composed of a material that is different than a material of the first frame 114. For example, the first frame 114 may be composed of a carbon fiber and the second frame 116 may be composed of a plastic resin or material. Using different materials for the first frame 114 and the second frame 116 may provide different durability, reduce costs, provide different melting points of the materials, etc. For example, the second frame 116 may be formed from a material having a lower melting temperature than a material used to form the first frame 114. For example, forming the first and second frames 114 and 116 from different materials may reduce damage to the foldable insert during formation of the second frame 116.

The second frame 116 of the illustrated example is substantially smaller than the first frame 114. For example, the dimensional height 130 of the second frame 116 may be between approximately 0.2 millimeters and 10 millimeters. For example, the second frame 116 has a surface area of approximately between 1% and 10% of a surface area of the cover 108 and/or the first frame 114. Further, the second frame 116 may have a dimensional thickness 804 that is substantially similar (e.g., equal to) to a dimensional thickness 806 of the first frame 114. In addition, the second frame 116 of the illustrated example defines side walls 808 that form an opening that defines at least a portion of the cavity 122 of the cover 108 (see FIG. 1B).

Although not shown, mechanical features such as, for examples, hooks, latches, clips, openings, slots and/or another other mechanical feature(s) may be provided during formation of the second frame 116 to facilitate coupling the part 100 to another housing component or cover.

Figure 9:
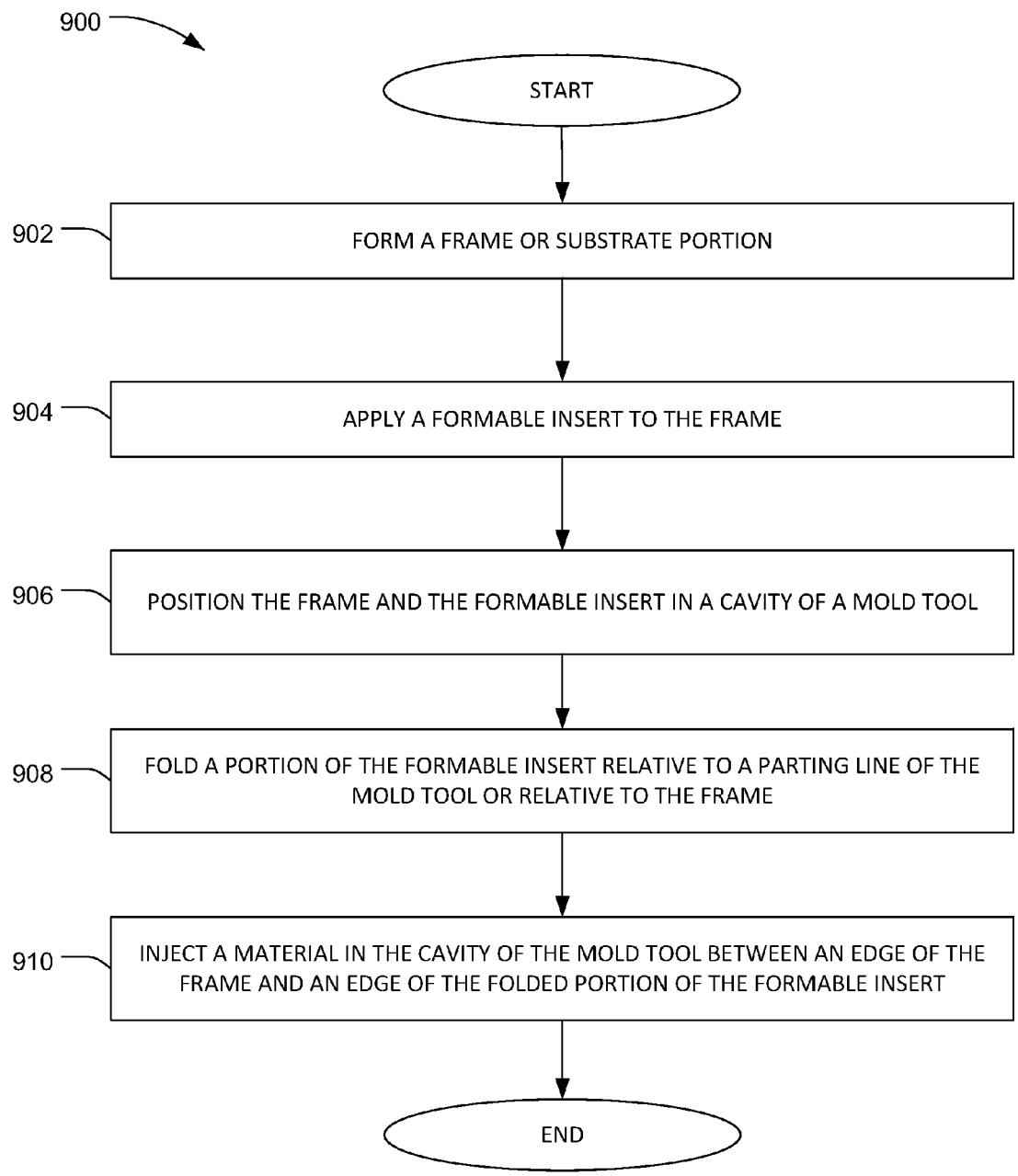
FIG. 9 is a flowchart of an example process to form an example part in accordance with the teachings described herein.

FIG. 9 is a flowchart of an example method 900 to form an example part disclosed herein (e.g., the example part 100 of FIGS. 1A and 1B). While an example manner of forming an example part has been illustrated in FIG. 9, one or more of the steps and/or processes illustrated in FIG. 9 may be combined, divided, re-arranged, omitted, eliminated and/or implemented in any other way. Further still, the example method 900 of FIG. 9 may include one or more processes and/or steps in addition to, or instead of, those illustrated in FIG. 9, and/or may include more than one of any or all of the illustrated processes and/or steps. Further, although the example method 900 is described with reference to the flow chart illustrated in FIG. 9, other methods of forming the example part 100 of FIGS. 1A and 1B may alternatively be used.

Referring to FIG. 9, the example method 900 of forming a part includes providing or forming a frame or substrate portion (e.g., the first frame 114 of FIG. 2) (block 902). The frame may be formed via injection molding, forming, machining, and/or any other manufacturing process(es). Further, the frame may be composed of any suitable material (s) such as, for example, a plastic material, a metal, a fiber, a composite, an alloy and/or any combination thereof. The example frame is formed slightly smaller than (e.g., between approximately 1% and 10% less than) a finished or desired part (e.g., the part 100).

A formable insert (e.g., the formable insert 102 of FIGS. 1A and 1B) is then applied to the frame (block 904). For example, the formable insert 102 may be applied to the first frame 114 as shown in FIG. 4. The formable insert may include an adhesive (e.g., the adhesive 314) and/or a backing to facilitate adhesion and/or shaping of the formable insert to the frame. The formable insert may be pressed on the frame and heat may be applied to facilitate shaping and/or adhesion of the formable insert to the frame.

The frame, having the attached formable insert, is then positioned in a cavity of a mold tool (block 906). Once the frame and the attached formable insert are positioned in the mold tool, a portion (e.g., the lip 502 of FIG. 5 and FIG. 7) of the foldable insert is folded relative to a parting line (e.g., the parting line 704) of the mold tool and/or relative to perimeter edges of the frame (block 908). For example, as shown in FIG. 7, the slide 700 may be employed to fold the lip 502 toward the inner surface 112 of the first frame 114.

With the portion folded of the foldable insert relative to the perimeter edges of the frame, a second material is injected in the mold tool between an edge of the frame and an edge of the foldable portion of the formable insert to encase, capture, embed and/or otherwise couple the formable insert relative to the frame (block 910). For example, the injected material may form another frame (e.g., the second frame 116 of FIG. 8) to capture or couple the edge of the formable insert relative to the frame. The frame and the other frame may be composed of the same material and/or different materials and may be formed as substantially unitary structures.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. A method of forming a cover with a formable insert, the method comprising:
    attaching a formable insert to a first frame portion of the cover, wherein the first frame portion is formed before attaching the formable insert to the first frame portion;
    applying heat to the formable insert to form the formable insert to a shape of the first frame portion; and
    forming a second frame portion of the cover via injection molding subsequent to the formation of the first frame portion to capture a perimeter edge of the formable insert in the second frame portion of the cover, wherein the second frame portion of the cover is smaller than the first frame portion of the cover.

2. The method of claim 1, wherein forming the second frame portion to capture the perimeter edge of the formable insert comprises encasing the perimeter edge in the second frame portion such that the perimeter edge of the formable insert is not visible from an exterior surface of the cover.

3. The method of claim 1, further comprising providing a foldable portion or lip of the formable insert that protrudes from respective perimeter edges of the first frame portion when the formable insert is attached to the first frame portion.

4. The method of claim 1, further comprising forming the first frame portion via injection molding.

5. The method of claim 1, further comprising positioning the first frame portion and the attached formable insert in a cavity of a mold tool prior to the injection molding.

6. The method of claim 5, further comprising folding the foldable portion of the formable insert toward an inner surface of the first frame portion via a slide prior to the injection molding.

7. The method of claim 1, wherein forming the first frame portion comprises forming the first frame portion to have a first surface area of approximately between 90% and 99% of a surface area of the cover.

8. The method of claim 1, wherein forming the second frame portion comprises forming the second frame portion to have a surface area of approximately between 1% and 10% of a surface area of the cover.

9. The method of claim 1, wherein forming the first frame portion comprises forming the first frame portion to have a first dimensional value that is less than a respective dimensional value of the cover.

10. The method of claim 9, wherein forming the second frame portion comprises forming the second frame portion to have a second dimensional value that is substantially equal to the difference between the respective dimensional value of the cover and the first dimensional value of the first frame portion.

11. The method of claim 10, wherein the respective dimensional value of the cover comprises a dimensional height of a side of the cover.

12. The method of claim 1, wherein the formable insert comprises leather.

13. A method of forming a cover with a formable insert, the method comprising:
    forming a first frame composed of a first material, the first frame having a first dimensional height that is less than a respective dimensional height of the cover, wherein the first frame defines an opening to receive a feature of a mobile device;
    applying heat to the formable insert to form the formable insert to a shape of the first frame;
    applying the formable insert to the first frame such that a foldable portion of the formable insert protrudes from respective perimeter edges of the first frame;
    positioning the formable insert and the first frame in a mold tool;
    folding the foldable portion of the formable insert relative to respective perimeter edges of the first frame such that the perimeter edges of the formable insert are oriented toward an inner surface of the first frame; and
    injecting a second material adjacent the folded portion of the formable insert to capture the perimeter edges of the formable insert in the second material, wherein a volume of the injected second material is smaller than a volume of the first material that forms the first frame.

14. The method of claim 13, wherein injecting the second material comprises injecting the second material in the mold tool between the foldable portion and the first frame to define a second frame of the cover.

15. The method of claim 14, further comprising placing the first frame and the formable insert in the mold tool prior to forming the second frame.

16. The method of claim 13, further comprising folding the formable insert toward the inner surface of the first frame when the formable insert and the first frame are positioned in the mold tool.

17. The method of claim 13, further comprising folding the foldable portion toward the inner surface of the first frame via a slide of the mold tool.

18. The method of claim 13, further comprising forming the second frame to have a second dimensional height that is substantially equal to a difference between the dimensional height of the cover and the first dimensional height of the first frame.

* * * * *